(12) United States Patent
Singh et al.

(10) Patent No.: US 9,041,601 B2
(45) Date of Patent: May 26, 2015

(54) GNSS STATE MACHINE SEARCHING RECEIVED SIGNAL, MOVING BITS, UPDATING REGISTERS

(71) Applicant: Texas Instruments Incorporated, Dallas, TX (US)

(72) Inventors: Jasbir Singh, Karnataka (IN); Jawaharlal Tangudu, Karnataka (IN); Aravind Ganesan, Karnataka (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/047,131

(22) Filed: Oct. 7, 2013

(65) Prior Publication Data
US 2014/0035784 A1 Feb. 6, 2014

Related U.S. Application Data

(62) Division of application No. 13/860,027, filed on Apr. 10, 2013, now Pat. No. 8,581,780, which is a division of application No. 12/980,360, filed on Dec. 29, 2010, now Pat. No. 8,436,771.

(51) Int. Cl.
*G01S 19/28* (2010.01)
*G01S 19/30* (2010.01)
*G01S 19/37* (2010.01)
*G01S 19/24* (2010.01)
*G01R 31/28* (2006.01)

(52) U.S. Cl.
CPC .............. *G01S 19/28* (2013.01); *G01S 19/30* (2013.01); *G01S 19/37* (2013.01); *G01S 19/24* (2013.01); *G01R 31/2851* (2013.01)

(58) Field of Classification Search
USPC ........... 342/357.67, 357.75, 357.77, 378, 189
See application file for complete search history.

(56) References Cited

U.S. PATENT DOCUMENTS

| 8,484,390 B2 * | 7/2013 | Hartwich et al. ............... 710/52 |
| 2008/0071995 A1 * | 3/2008 | Chen et al. ..................... 711/147 |
| 2010/0202316 A1 * | 8/2010 | Terasawa et al. ............. 370/252 |

* cited by examiner

*Primary Examiner* — Harry Liu
(74) *Attorney, Agent, or Firm* — Lawrence J. Bassuk; Frank D. Cimino

(57) ABSTRACT

Enhancing search capacity of Global Navigation Satellite System (GNSS) receivers. A method for searching satellite signals in a receiver includes performing a plurality of searches sequentially. The method also includes storing a result from each search of the plurality of searches in a consecutive section of a memory. Further, the method includes detecting free sections in the memory. The method also includes concatenating the free sections in the memory to yield a concatenated free section. Moreover, the method includes allocating the concatenated free section for performing an additional search.

5 Claims, 10 Drawing Sheets

GNSS STATE MACHINE SEARCHING RECEIVED SIGNAL, MOVING BITS, UPDATING REGISTERS

This application is a Divisional of prior application Ser. No. 13/860,027, filed Apr. 10, 2013, now U.S. Pat. No. 8,581,780, issued Nov. 12, 2013;

Which was a Divisional of prior application Ser. No. 12/980,360, filed Dec. 29, 2010, now U.S. Pat. No. 8,436,771, granted May 7, 2013.

TECHNICAL FIELD

Embodiments of the disclosure relate to a Global Navigation Satellite System (GNSS) receiver.

BACKGROUND

A GNSS receiver determines its position using satellites. The GNSS receiver processes a received signal to determine presence of signals from various satellites. If presence of a signal from a satellite is detected, then the satellite is determined as a "visible" satellite. After the visible satellites are determined, the GNSS receiver further processes the signals from the visible satellites to determine its position. Time required by the GNSS receiver to determine its position is dependent on time consumed by the GNSS receiver in performing the search for the visible satellites. Hence, it is desired to minimize time consumed by the GNSS receiver in performing the search for the visible satellites and in giving a position fix.

An exemplary GNSS receiver that performs the search is illustrated in FIG. 1 (Prior Art). The received signal is received by an antenna 105 and processed using a circuit 110. The circuit 110 can include a radio frequency processing circuit that down-converts the received signal to intermediate frequency for further processing. An analog-to-digital converter (ADC) 115 converts output of the circuit 110 into digital samples. A filter and decimation block 120 filters the digital samples to reduce sampling rate and to bring the received signal to baseband. The digital samples are then stored in a buffer 125. Correlators 130A to 130N access the digital samples from the buffer 125 and store correlation results in a corresponding section in a memory 145. For example, a correlator 130A stores correlation result in a section 135A of the memory 145. Each correlator and the corresponding section in the memory 145 correspond to a channel. Each channel is capable of searching for a signal from a particular satellite. The correlation results are indicative of visible satellites. Once a visible satellite is detected, a tracking channel 140 tracks the visible satellite to receive data and to track the position. However, searches corresponding to various channels are performed in parallel using several correlators leading to high cost. Further, each channel is allocated a section, in the memory 145, required for worst case search leading to inefficiency. Moreover, searches corresponding to various channels may require different memory sizes based on mode of operation of the GNSS receiver and hence allocation of the section based on worst case search requirement leads to wastage of the memory 145.

SUMMARY

An example of a method for searching satellite signals in a receiver includes performing a plurality of searches sequentially. The method also includes storing a result from each search of the plurality of searches in a consecutive section of a memory. Further, the method includes detecting free sections in the memory. The method also includes concatenating the free sections in the memory to yield a concatenated free section. Moreover, the method includes allocating the concatenated free section for performing an additional search.

An example of a method for searching satellite signals from a plurality of satellites in a global navigation satellite system receiver includes allocating a plurality of sections of a memory for a plurality of searches. Each search of the plurality of searches is a 3-dimensional search. The 3-dimensional search includes searching for a code for all code phases for one Doppler hypothesis. The code corresponds to a satellite. The method also includes performing a plurality of searches sequentially. The method includes storing a result from each search of the plurality of searches in a corresponding allocated section of the plurality of sections of the memory. The method also includes detecting at least one of termination of at least one group of code phase searches for a particular search in the plurality of searches, and termination of all code phases for the particular search from the plurality of searches. The method further includes detecting free sections in the memory based on detecting termination. Moreover, the method includes concatenating the free sections to yield a concatenated free section if the free sections, in conjunction, are sufficient for performing an additional search. Furthermore, the method includes allocating the concatenated free section for performing the additional search.

An example of a receiver includes a correlator, a memory and a memory squeezing unit in electronic communication with the correlator and the memory. The memory squeezing unit includes a plurality of status registers, a plurality of shadow registers, a plurality of sets of configuration registers and a state machine. The state machine is in electronic communication with the plurality of status registers, the plurality of shadow registers, and the plurality of configuration registers to enable searching for presence of data in a received signal by processing the received signal, moving bits from the plurality of shadow registers to the plurality of status registers based on the processing, and updating the plurality of configuration registers based on the processing.

BRIEF DESCRIPTION OF THE VIEWS OF DRAWINGS

DETAILED DESCRIPTION OF THE EMBODIMENTS

Figure 1:
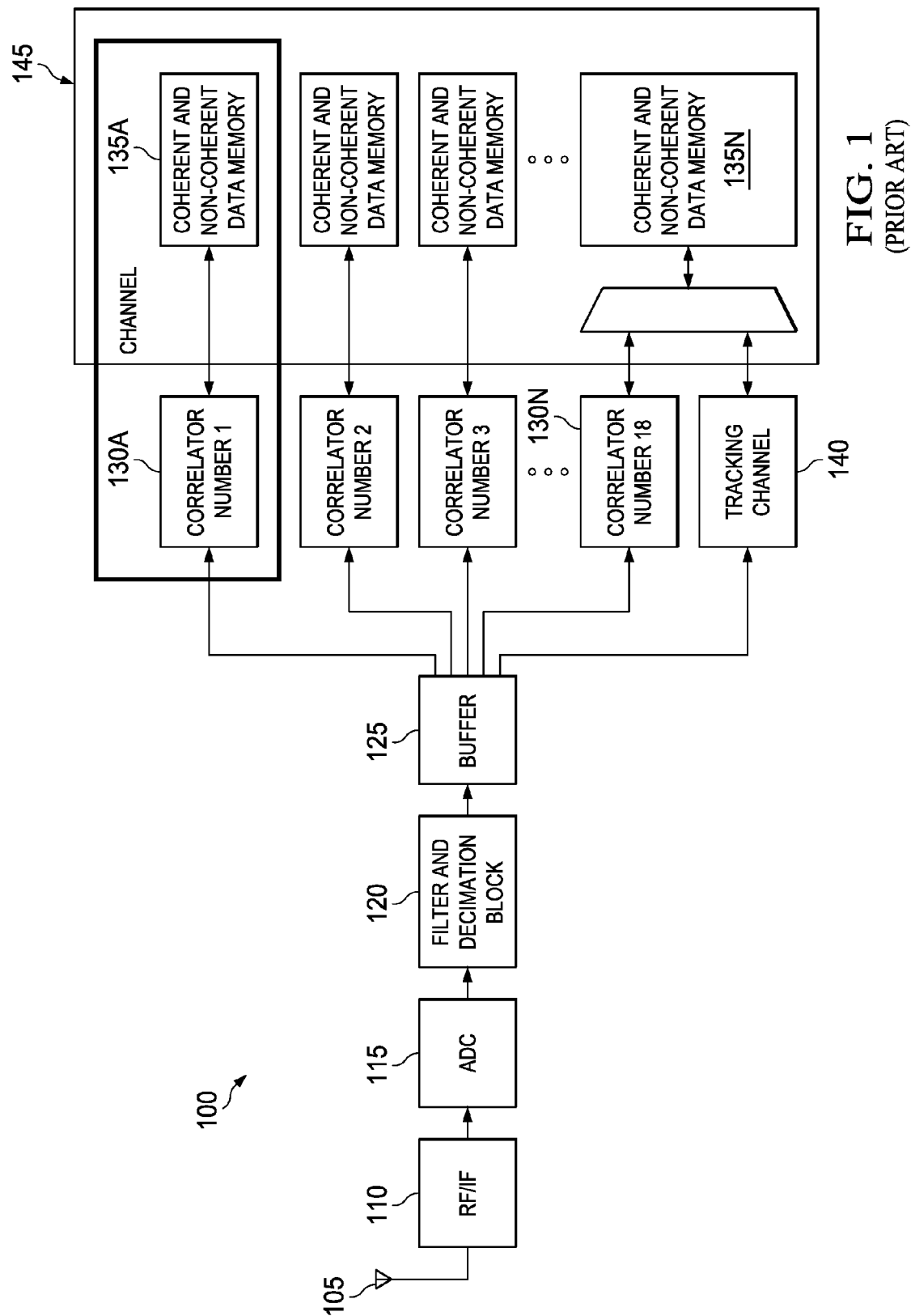
FIG. 1 illustrates a portion of a receiver, in accordance with prior art.
Figure 2:
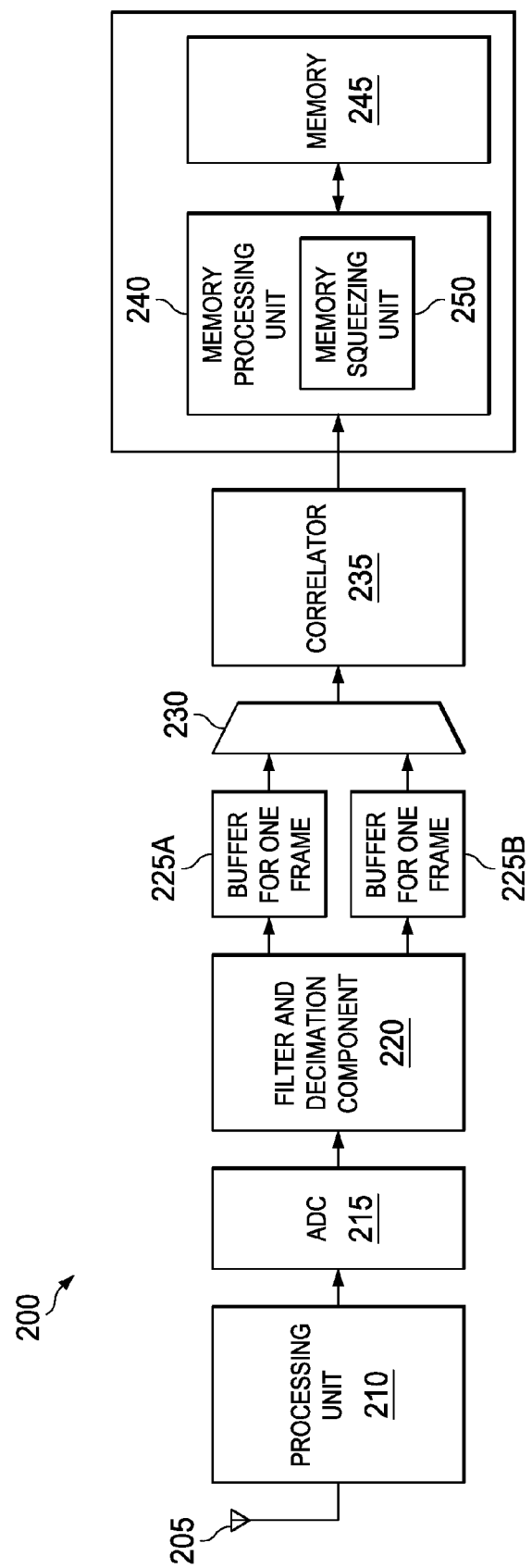
FIG. 2 illustrates a portion of a receiver, in accordance with one embodiment.

FIG. 2 illustrates a portion 200 of a receiver. The receiver can be a Global Navigation Satellite System (GNSS) receiver or a Global Positioning System (GPS) receiver. Applications of the receiver include, but are not limited to, emergency and location based applications, geo-tagging, and geo-fencing. The receiver can be present in various electronic devices, for example a Personal Navigation Assistant (PNA) or a Portable Navigation Device (PND), a car navigation system, and a mobile phone.

The portion 200 searches for visible satellites. The "visible satellites" are defined as satellites having line-of-sight path to the receiver for communication. A satellite can be determined as a visible satellite by searching for and detecting presence of data from the satellite in a received signal. The received signal is defined as a signal received by the receiver. Once a visible satellite is determined, the visible satellite is tracked at a resolution higher than that for searching. Higher resolution indicates higher sampling rate. Tracking the visible satellite at the higher resolution enables the receiver to find position of the receiver with higher accuracy in three-dimensional (3D) position co-ordinates. The position of the receiver can then be communicated to a user of an electronic device that includes the receiver.

The portion 200 includes an antenna 205. The antenna 205 is coupled to a processing unit 210. The processing unit 210 is coupled to an analog-to-digital converter (ADC) 215. The ADC 215 is further coupled to a filter-and-decimation component 220. The filter-and-decimation component 220 is coupled to a buffer, for example a double buffer. The double buffer includes a buffer 225A and a buffer 225B. An example of the double buffer is a ping-pong buffer. The double buffer is coupled to a multiplexer 230. The multiplexer 230 is coupled to a correlator 235. The correlator 235 is coupled to a memory processing unit 240 that includes a memory squeezing unit 250. The memory processing unit 240 is further coupled to a memory 245.

The antenna 205 receives and provides the received signal to the processing unit 210. The received signal includes data, also referred to as satellite signals, from one or more satellites.

Each satellite signal includes message data modulated by a code. The message data modulated by the code is transmitted on a high frequency carrier. The message data includes, but is not limited to, information on co-ordinates of the satellite, orbit of the satellite, synchronous time information and health of the satellite. Examples of the code include, but are not limited to, a gold code (C/A), a Barker code, a pseudorandom code, and a Welsh code. In one example, when the satellite signal is from a GPS satellite, the code of the satellite signal can have a length of 1023 bits (also referred to as chips) and a period of 1 millisecond (ms). In another example, when the satellite signal is from a GLObal NAvigation Satellite System (GLONASS) satellite, the code of the satellite signal can have a length of 511 bits/chips and a period of 1 ms.

The code is used to identify presence of the satellite signal in the received signal. There is a time lag between transmission of the satellite signal from the satellite and receipt of the satellite signal by the receiver. The time lag can be defined as an indication of distance between the satellite and the user, which is used for trilateration calculations to compute location of the receiver. The code can be shifted in order to identify presence of the satellite signal for the time lag. Shifting also helps in determining magnitude of the time lag. Each shifted version of the code can be referred to as a "code phase". Searching for the exact time lag is referred to as a "code phase search".

In one example, the portion 200 searches for presence of satellite signals from 32 satellites in the GPS constellation and hence there are 32 codes. One code corresponds to one satellite. Each code is unique and orthogonal to the rest of the codes. The portion 200 identifies the satellites through these respective unique codes. For example, a GLONASS satellite, having a frequency division multiple access (FDMA) signal structure, is identified by its frequency band which is different with respect to other satellites.

The processing unit 210 includes a Low Noise Amplifier (LNA), a down-converter, and filtering circuitry. The LNA amplifies the received signal and the down-converter then down-converts the received signal to an Intermediate Frequency (IF) signal. The ADC 215 converts output (the IF signal) of the processing unit 210 into digital samples.

The filter-and-decimation component 220 converts the IF signal to baseband. The filter-and-decimation component 220 performs decimation operation on the digital samples to decrease sampling rate. The digital samples obtained as output of the filter-and-decimation component 220 are referred to as filtered samples. The filtered samples corresponding to one frame are stored in the buffer 225A or the buffer 225B. In one example, a frame is equal to a time period of 1 ms. When the filtered samples in the buffer 225A are being processed, the filtered samples corresponding to next frame are being stored in the buffer 225B and when the filtered samples in the buffer 225B are being processed, the filtered samples corresponding to next frame are being stored in the buffer 225A. The multiplexer 230 selects filtered samples from the buffer 225A or the buffer 225B.

Various other circuits than those shown in FIG. 2 may be present to process the received signal before the filtered samples are obtained.

The portion 200 is capable of performing a plurality of searches, hereinafter referred to as "the searches", sequentially. In one example, the searches can be performed sequentially using time division multiplexing within a code frame. A search can be defined as a 3-dimensional search including search for a code, search for the code for various code phases, and search for the code for various code phases for one Doppler hypothesis. Due to relative movement of the satellites and the user, there can be a Doppler shift in frequency of the received signal. To account for the Doppler shift, the search is performed for different Doppler hypotheses. A "Doppler hypothesis" is defined as an estimate of the Doppler shift in the frequency. Several such estimates are considered.

The searches can be enabled by the correlator 235, the memory squeezing unit 250, and the memory 245.

The portion 200 is capable of generating various codes locally. Each code corresponds to a satellite. The correlator 235 enables a first search by correlating the received signal with a first code for various code phases for a first Doppler hypothesis. The first search corresponds to a search for the satellite signal from a first satellite for the first Doppler hypothesis. Any satellite can be referred to as the "first satellite". The search for the satellite signal from the first satellite can be referred to as the first search. Any Doppler hypothesis can be referred to as the "first Doppler hypothesis". The first code is generated locally by the portion 200.

The correlator 235 correlates the filtered samples selected by the multiplexer 230 with the first code. The first code is shifted by one chip with respect to the filtered samples and correlation is then performed with shifted first code. The first code is shifted by two chips and correlation is then performed with shifted first code. Process of shifting the first code and correlating the filtered samples with shifted first code is continued until the first code is shifted by N chips with respect to the filtered samples. Correlation of the filtered samples with the shifted first code is referred to as a code phase search.

Output of the correlation with the first code is then stored in a first section of the memory 245. Similarly outputs of various correlations with various codes are stored in different sections of the memory 245.

In some scenarios, the satellite signal is weak and has lesser power than a thermal noise floor. In one example, in open sky conditions, the power of the satellite signal is −130 dBm and that corresponding to the noise floor is −111 dBm. The power of the satellite signal is thus 19 dBm below the noise floor. To detect the presence of the satellite signal in the received signal, signal-to-noise ratio (SNR) of the received signal needs to be improved. The SNR can be improved by performing coherent integrations and non-coherent integrations. A coherent integration includes summing the correlation result corresponding to a code phase across multiple frames after determining the Doppler shift through the Doppler hypotheses and removing the Doppler shift for particular Doppler hypothesis. The coherent integration includes integrating I and Q components of the received signal separately. A non-coherent integration includes accumulating absolute values of accumulated data from the coherent integration. Accumulated data from the coherent integration is referred to as "pred data" or "pred result" or "coherent data" or "coherent result". Accumulated data from the non-coherent integration is referred to as "postd data" or "postd result" or "non-coherent data" or "non-coherent result".

For example, the first code has 1023 chips. All code phase searches of the first code are performed in every 1 ms period of 1 second (s). Correlation results corresponding to each code phase search in 1 ms periods are summed over 1 s. For perfect correlation of a code phase, the correlation result corresponding to the code phase and summed over 1 s will be a maximum value that will exceed a predetermined threshold (first threshold). But in case there is no alignment between the first code generated by the portion 200 and that of the satellite signal, for the code phase and the first Doppler hypothesis, then the correlation result summed over 1 s will not be a maximum value as the correlation result will not cross the predetermined threshold. The correlation result hence resembles random noise.

If correlation values corresponding to all code phase searches summed over 1 s do not exceed the first threshold then the first search is terminated.

The correlator 235 is time-shared between correlations corresponding to each search. The correlator 235 performs correlations corresponding to the first search, and corresponding coherent data and non-coherent data are then stored in the first section of the memory 245. The coherent data and the non-coherent data together are referred to as a "result" of the first search. Similarly, the correlator 235 performs correlations corresponding to a second search and corresponding coherent data and non-coherent data are then stored in a second section of the memory 245. The memory 245 thus enables searching for presence of the satellite signals in the received signal by storing the coherent data and the non-coherent data of the correlations corresponding to the searches.

Initially, before searching starts, various sections in the memory 245 are allocated for performing the searches for the satellite signals. In some embodiments, if no prior searching is done then the sections of identical size can be allocated for each search.

In some embodiments, allocation is based on mode of operation of the receiver. For example, when the receiver is in a hot start mode or in assisted GPS mode, the receiver has some prior information corresponding to the first satellite. Hence the first search may not include correlations corresponding to all the code phases. The mode of operation of the receiver can be the hot start mode when the receiver is powered OFF and ON within a short span of time, for example one minute. The first section of the memory 245 allocated for the first search can then be smaller as compared to sections allocated for other searches.

The memory squeezing unit 250 communicates electronically with the correlator 235 and the memory 245. The memory squeezing unit 250 allocates the sections of the memory 245 for the searches. The correlator 235 then in conjunction with the memory 245 and the memory squeezing unit 250 performs the searches.

After some time from start of the searches, a few searches may be terminated due to detection of absence of a satellite signal, also called a noise early termination, or due to presence of a satellite signal, also called a signal early termination. Termination or completion of the few searches can leave intermediate sections of the memory 245 unused. The unused sections are referred to as free sections. It may also happen that instead of an entire search across all code phase searches for a particular satellite being terminated, a few code phase searches are terminated. In case of termination of a few code phase searches, an entire section of the memory 245 allocated for the corresponding search may not be free but a few locations in that section may become free. The few locations that are free are also referred to as "the free sections". A "location" is defined as a portion of a memory with an address. A group of one or more locations is termed a "section".

The memory squeezing unit 250 then detects the free sections in the memory 245 and concatenates the free sections towards the end of the memory 245 to yield a concatenated free section. The concatenated free section is then allocated for performing an additional search. The additional search is defined as a search other than the searches already performed. The search or searches to which the concatenated free section is allocated are referred to as the additional search or additional searches.

In one example, the additional search can include a search for a satellite signal from a satellite that was not considered in the searches already performed. In another example, the additional search can include a search for the satellite signal from the first satellite for a second Doppler hypothesis. Selection of the searches that need to be performed can be done based on requirements. Various algorithms based on which searches need to be selected can be included as firmware in the receiver. In one example, N number of searches considered for processing sequentially can be selected based on N satellites. One search from N searches corresponds to one satellite. In another example, N number of searches considered for processing sequentially can be selected based on N Doppler hypotheses. One search from N searches corresponds to one Doppler hypothesis. Two searches from N searches can include searching for the same code but for different Doppler hypotheses. It is noted that various combinations of the Doppler hypotheses and the codes can be used for the searches.

The correlation results stored in the memory 245 are processed to determine presence of the satellite signal. For example, a signal-to-noise ratio (SNR) is calculated based on the correlation results stored in the memory 245 and checked against the first threshold. If the SNR exceeds the first threshold then presence of the satellite signal is confirmed and the corresponding satellite is determined as a visible satellite. The portion 200 can then fix to and start tracking the visible satellite to determine the position of the receiver.

The memory squeezing unit 250 includes various elements for detecting the free sections, concatenating the free sections and allocating the concatenated free section to the additional search. The memory squeezing unit 250 including the elements is explained in detail in conjunction with FIG. 3.

Figure 3:
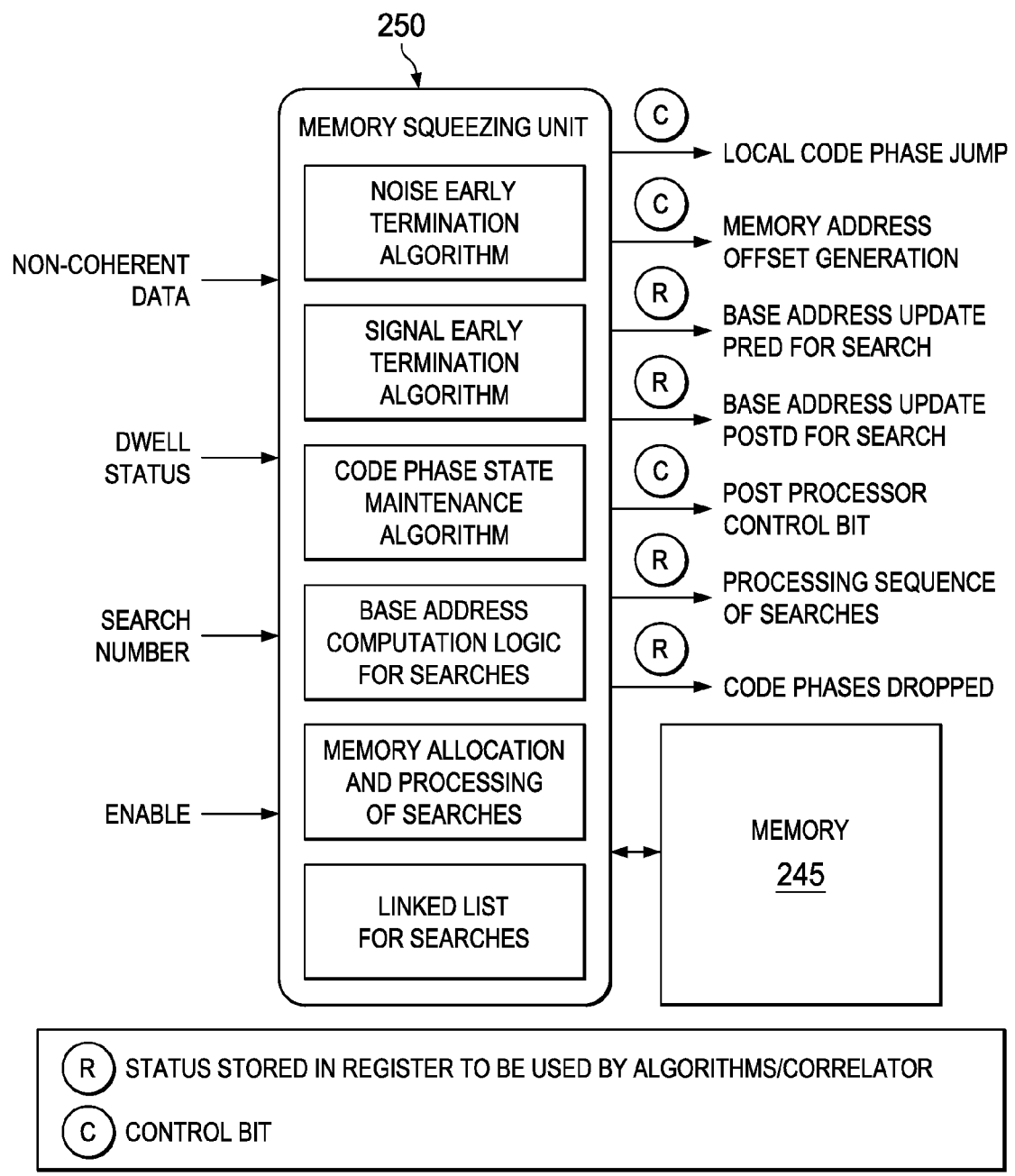
FIG. 3 illustrates operation of a memory squeezing unit, in accordance with one embodiment.

Referring to FIG. 3 now, the memory squeezing unit 250 can be a hardware controller that controls operation of the memory 245 and the correlator 235. The memory squeezing unit 250 includes various registers and gates, and hosts various algorithms to perform the searches in conjunction with the memory 245 and the correlator 235. The algorithms and hardware configuration of the memory squeezing unit 250 are now explained in conjunction with FIG. 3 to FIG. 9.

In some embodiments, the memory squeezing unit 250 can be a part of the controller, for example the memory processing unit 240, for performing specified functions.

The memory squeezing unit 250 detects free sections in the memory 245 by detecting at least one of termination of at least one group of code phase searches for a particular search in the searches, and termination of all code phases for the particular search from the searches. In other words, the memory squeezing unit 250 detects free sections in the memory 245 by detecting termination of any number of searches or by detecting termination of any number of code phase searches or a combination of both. Any search from the searches can be referred to as the first search or the second search.

Noise Early Termination Algorithm

The memory squeezing unit 250 hosts a noise early termination algorithm which is now explained. In order to enable faster searches and utilize the memory 245 to maximum extent, the memory squeezing unit 250 calculates SNR of the satellite signal every few milliseconds (ms). The SNR is calculated by summing the correlation results of an ongoing code phase search. The correlation results are summed over N ms and the sum is compared with a threshold (second threshold). Value of N can be determined based on the noise early termination algorithm. The second threshold varies with inclusion of every new correlation result in the sum. The magnitude of the second threshold varies and is represented as a predetermined threshold slope. Based on comparison of the SNR with the second threshold, a determination is made by the memory squeezing unit 250 regarding dropping the code phase search. When the SNR of the satellite signal is below the second threshold then the code phase search is dropped, and the coherent data and the non-coherent data of the code phase search are not stored in the memory 245. The dropping of the code phase search before termination of a dwell due to detection of noise is known as noise early termination. The dwell is indicative of the number of coherent integrations and the number of non-coherent integrations. For example, (M, N) dwell indicates M coherent integrations and N non-coherent integrations. The M coherent integrations and N non-coherent integrations depend on sensitivity of the code phase search.

Signal Early Termination Algorithm

When the SNR is found to be much greater than the second threshold then the search for the satellite is dropped since there is an indication of the presence of the satellite signal. The SNR can be determined to be much greater than the second threshold by checking whether the SNR exceeds the second threshold by a predefined value. The dropping of the search before termination of the dwell due to detection of the satellite signal is known as signal early termination. In case of the signal early termination, the entire search is terminated as compared to the noise early termination where individual code phases or groups of code phases can be dropped from a particular search.

Hence, some free sections in the memory 245 can be present due to noise early terminations or signal early terminations or both.

Code Phase State Maintenance Algorithm

Figure 4:
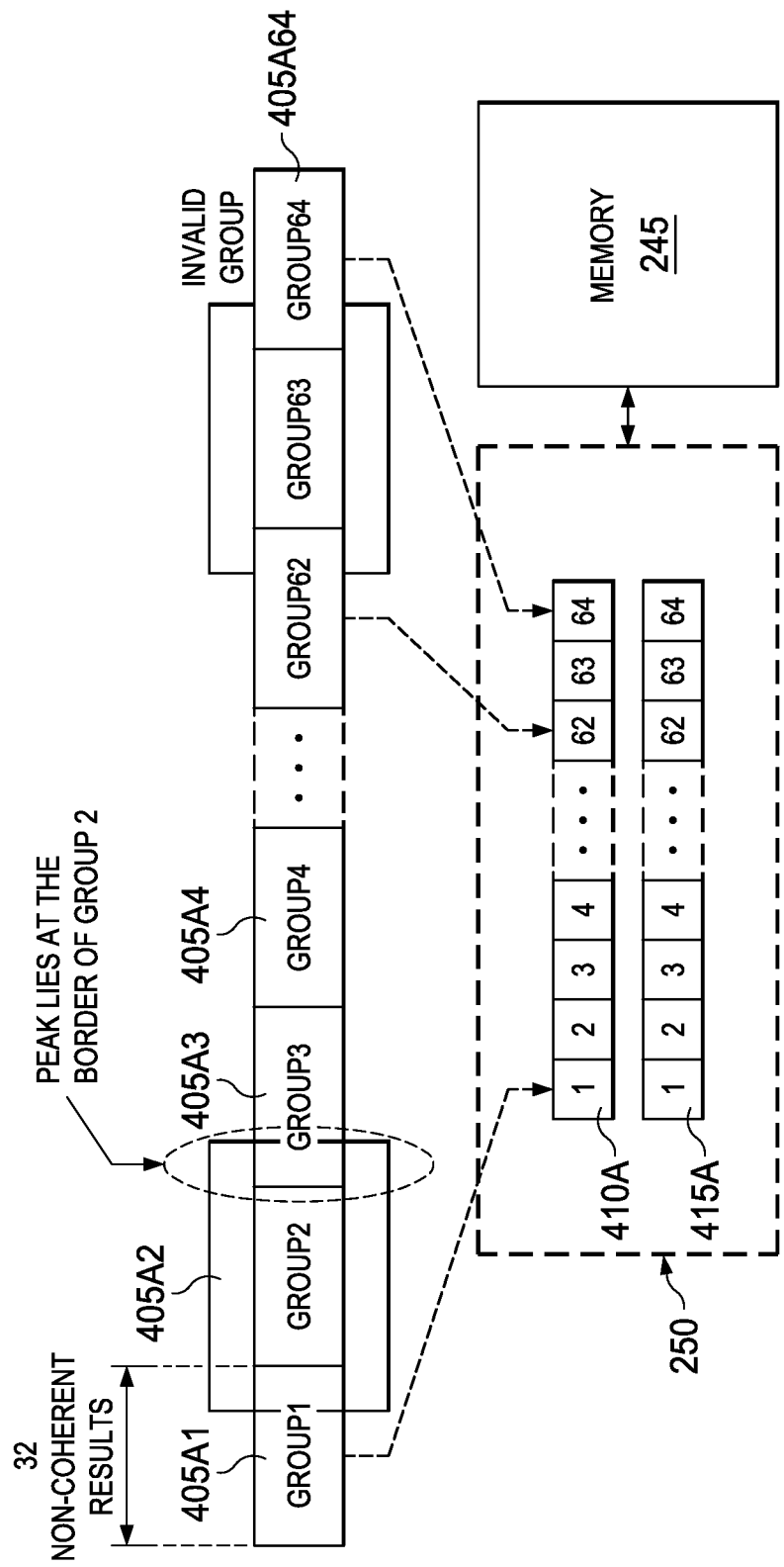
FIG. 4 illustrates memory allocation during noise early termination, in accordance with one embodiment.

The memory squeezing unit also hosts an algorithm for maintaining states of the code phases. This algorithm will now be explained. The memory squeezing unit 250 divides the code phases into groups as shown in FIG. 4. In one example, a resolution of 2 samples per second (sps) with 2046 code phases corresponding to 1023 chips of the code is considered. The 2046 code phases are divided into 64 groups with 32 code phases in each group. The 64 groups include a group 405A1 to a group 405A64. 2046 code phases correspond to one search. The noise early termination algorithm running in the memory squeezing unit 250 determines that one or more groups of the code phases have to be dropped when the respective SNRs do not cross the second threshold. The memory squeezing unit 250 maintains information on whether each group of the code phases has been dropped or not.

The memory squeezing unit 250 includes one or more status registers, for example a status register 410A, and one or more shadow registers, for example a shadow register 415A. One shadow register is present corresponding to one status register. A pair of a status register and a shadow register can correspond to one search.

One bit of the status register 410A corresponds to one group. Each status register has 64 bits (as shown in FIG. 4) corresponding to the 64 groups of code phases. The bits are called valid bits. Based on results of the noise early termination algorithm, the memory squeezing unit 250 updates the valid bits. The status register 410A indicates the valid bits in a current time period or current ms. The shadow register 415A indicates the valid bits for processing the search in a next time period or next ms. The shadow register 415A in conjunction with the status register 410A indicates the presence of free sections in the memory 245 for processing. The shadow register 415A also has 64 bits (as shown in FIG. 4) corresponding to the 64 groups of code phases.

The memory squeezing unit 250 uses samples from adjacent groups of code phases along with samples of a group of code phases to determine whether the group of code phases has to be dropped. For example, for a group 405A2, correlation results of the group 405A2 can be considered along with 10 correlation results of each adjacent group, for example a group 405A3 and the group 405A1. The results from the group 405A1 and the group 405A3 help in identifying peak signal values at edges of the group 405A2. When the valid bit corresponding to the group of code phases indicates that the group of code phases has been dropped, the memory squeezing unit 250 shifts the code by 32 bits. The group of code phases that is dropped is not used for further processing. Likewise, the 32 code phases that are dropped are not used for further processing.

Figure 5:
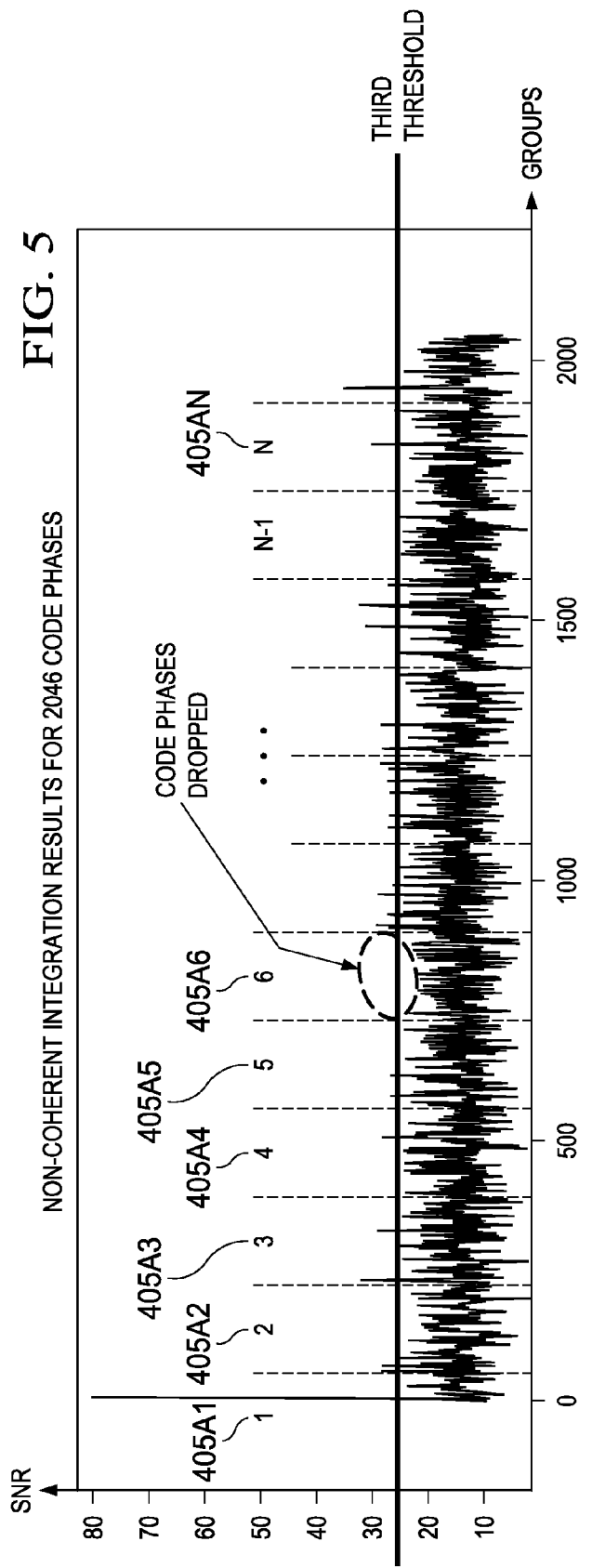
FIG. 5 illustrates state of a memory, in accordance with one embodiment.

An exemplary dropping of a group 405A6 is illustrated in FIG. 5. The SNR corresponding to the group 405A6 does not meet the second threshold and hence needs to be dropped. X axis in FIG. 5 represents the groups and Y axis represents the SNR.

If groups adjacent to a group are dropped then 32 correlation results of the group can only be used. For example, for a group 405A63 only 32 correlation results of the group 405A63 are considered.

Base Address Computation Logic for Searches

The memory squeezing unit 250 also uses the valid bits to determine the number of free sections in the memory 245 corresponding to each search and the total number of free sections in the memory 245. The memory squeezing unit 250 uses the total number of free sections to generate addresses of locations in the memory 245 where the correlation results have to be stored. For example, for concatenating the free sections towards the end of the memory 245 and yielding a concatenated free section, the memory squeezing unit 250 needs to shift the correlation results such that the correlation results are stored contiguously and there are no free sections between the correlation results. Storing the correlation results contiguously includes shifting the correlation results from non-consecutive sections in the memory 245 to consecutive sections in the memory 245. The memory squeezing unit 250 thus has to generate the addresses of the locations in the memory 245 to which the correlation results have to be shifted. One address corresponds to one correlation result of one search.

A section of the memory 245 corresponding to a search includes a first set of locations for storing coherent data of the search and a second set of locations for storing non-coherent data of the search. The address of each location in the first set is generated according to a base address of the coherent data. The base address of the coherent data is defined as the address of a first location in the first set. The address of each location in the first set is generated by adding an offset to the base address of the coherent data. Similarly, the address of each location in the second set is generated according to a base address of the non-coherent data. The sections of the memory 245 corresponding to different searches have different base addresses for the coherent data and for the non-coherent data, and the address of each location in each section is generated from the corresponding base address by adding offsets.

The memory squeezing unit 250 hosts logic for computing and generating the base addresses for coherent data and for non-coherent data. Further, the memory squeezing unit 250 updates the base addresses for the coherent data and for the non-coherent data for each search. For purpose of explanation, sections of the memory 245 can be allocated starting from top towards bottom. As the sections of the memory 245 are determined to be free and sufficient for starting the additional search, the free sections can be moved towards the bottom of the memory 245, and the base addresses are updated for each search based on the free sections in the memory 245 by performing vector addition of the valid bits. For example, for an ongoing search, vector addition of the valid bits for all searches performed before the ongoing search is done to update the base addresses for the coherent data and the non-coherent data in sections corresponding to the ongoing search. An ongoing search is defined as a search that is being performed. The section of the memory 245 corresponding to the ongoing search is defined as an ongoing section.

Memory Allocation and Processing of Searches

Figure 6:
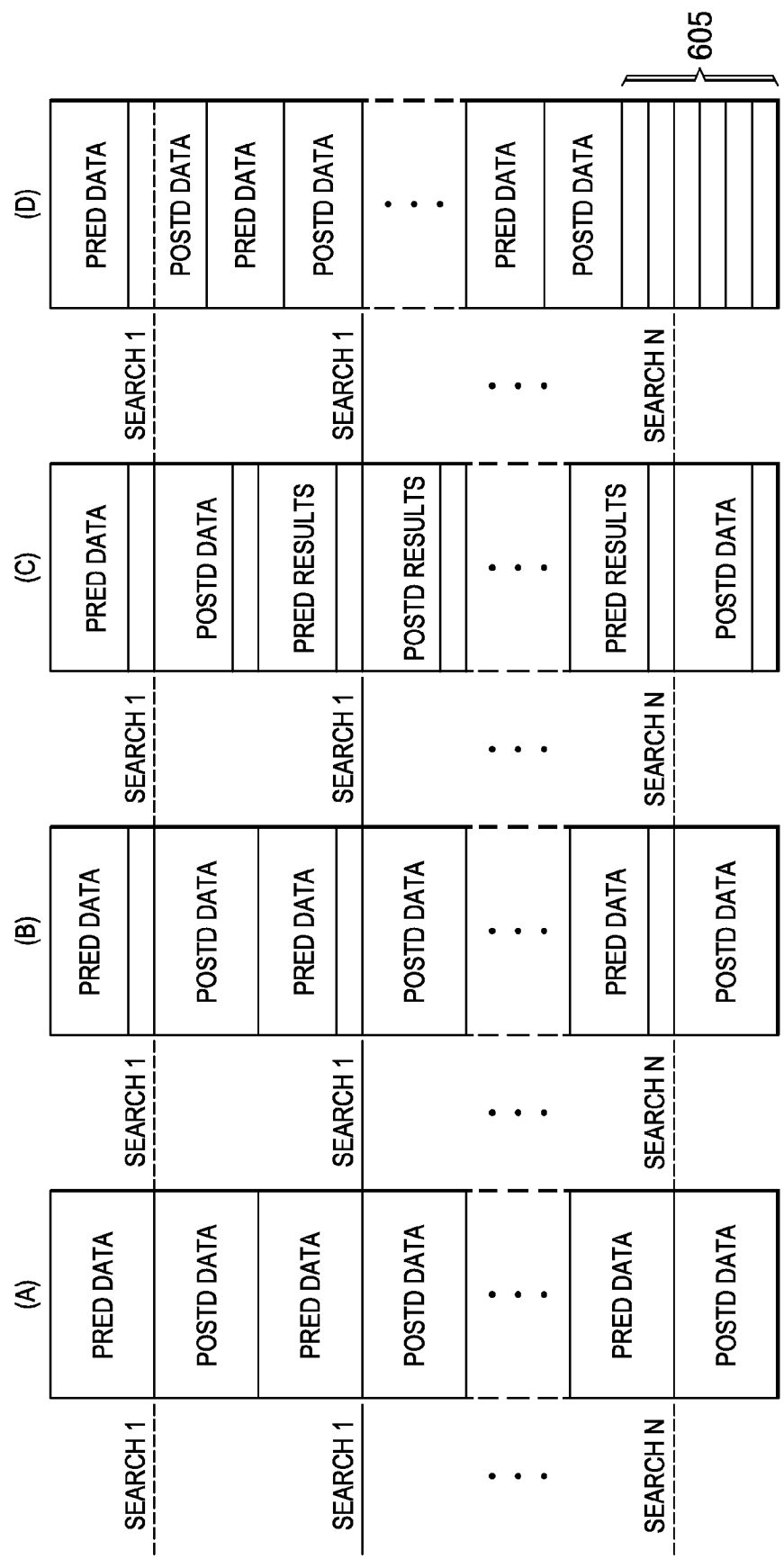
FIG. 6 illustrates allocation of a memory, in accordance with one embodiment.

An example of allocation of the memory 245 is now illustrated in conjunction with FIG. 6. Allocation of the memory 245 is illustrated using states "A", "B", "C" and "D". Referring to state "A" in FIG. 6, the memory 245 is completely filled by results of the searches. In illustrated example, N sections are allocated to N searches where each section can be used for storing a maximum possible number of correlation results. Each section includes two sets of locations, the first set for storing the coherent data and the second set for storing the non-coherent data.

For each search, due to noise early termination, one or more groups of code phases can be determined to be dropped. The coherent data is concatenated immediately, from next ms after determination of dropping of the groups. Referring to state "B" in FIG. 6, a few locations of the first set of locations for storing coherent data corresponding to each search are free. In the illustrated example, the starting address of the first set of locations corresponding to each search does not change. Shrinking of the coherent data happens at the boundary of the searches. State "B" of the memory 245 illustrates the shrinking (highlighted in gray).

State "C" of FIG. 6 illustrates shrinking of the non-coherent data. The shrinking of the non-coherent data is done in a next non-coherent (Postd) data frame. A non-coherent data frame is defined as a period of time after which non-coherent integration is performed. Movement of coherent and non-coherent correlation results are performed along with the coherent integrations and the non-coherent integrations. Further, no extra power is consumed while shifting the coherent data and the non-coherent data within similar boundaries for the base addresses. Values of the bits of the shadow register 415A are not changed until the next non-coherent data frame while values of the bits of the status register 410A are updated in the current non-coherent data frame. The shadow register 415A thus helps in determining if groups of code phases are dropped. The free locations in the first set of locations and the second set of locations can also be referred to as free sections. When firmware in the memory squeezing unit 250 determines that the free sections when concatenated are sufficient to start the additional search then the firmware issues a command to the memory squeezing unit 250 to concatenate the free sections. In some embodiments, the firmware can issue the command after every few milliseconds. The base addresses are now updated to move the coherent data and the non-coherent data to contiguous locations, and to concatenate the free sections. A concatenated free section 605 of the memory 245 is illustrated in state "D" of FIG. 6. The concatenation of the free sections to enable start of an additional search is now explained in detail.

Figure 7:
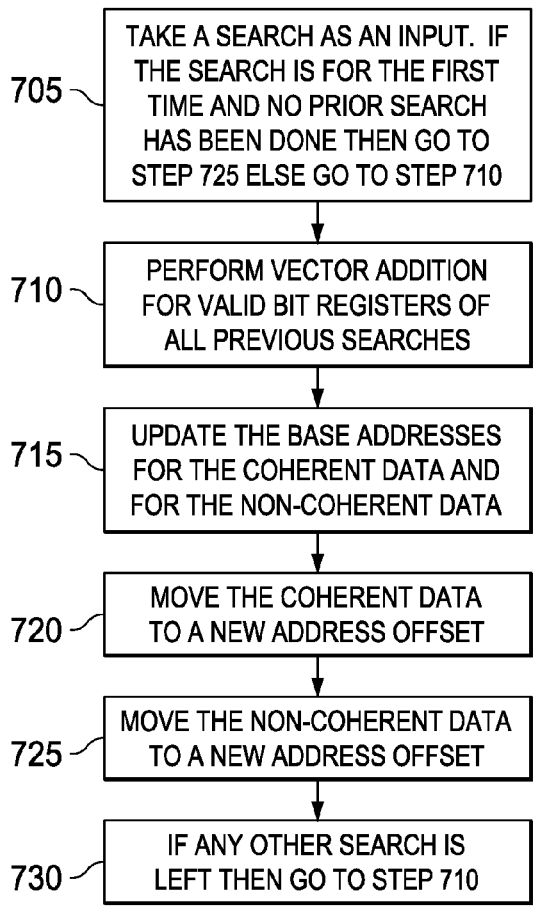
FIG. 7 illustrates steps performed by a state machine, in accordance with one embodiment.

For concatenation of the free sections, the memory squeezing unit 250 moves the coherent data and the non-coherent data to free locations in the sections of the memory 245 above the ongoing section. The concatenation can be implemented by the memory squeezing unit 250 using a hardware state machine (state machine) that is activated upon receipt of the command from the firmware. The state machine can be run after correlations for samples of a few milliseconds or frames have been done. In some embodiments, the memory 245 is not accessed when the state machine is run. The steps implemented using the hardware state machine are as follows. The steps are also illustrated in FIG. 7

Step 705 Take a search as an input. If the search is for the first time and no prior search has been done then go to step 730 else go to step 710.

Step 710 Perform vector addition for valid bit registers of all previous searches. Vector addition for valid bit registers of the ongoing search indicates total locations to be moved within the section for the ongoing search whereas vector addition for all the previous searches indicates the total address offset for data movement for the ongoing search.

Step 715 Update the base addresses for the coherent data and for the non-coherent data.

Step 720 Move the coherent data to a new address offset.

Step 725 Move the non-coherent data to a new address offset.

Step 730 If any other search is left then go to step 710.

Figure 8:
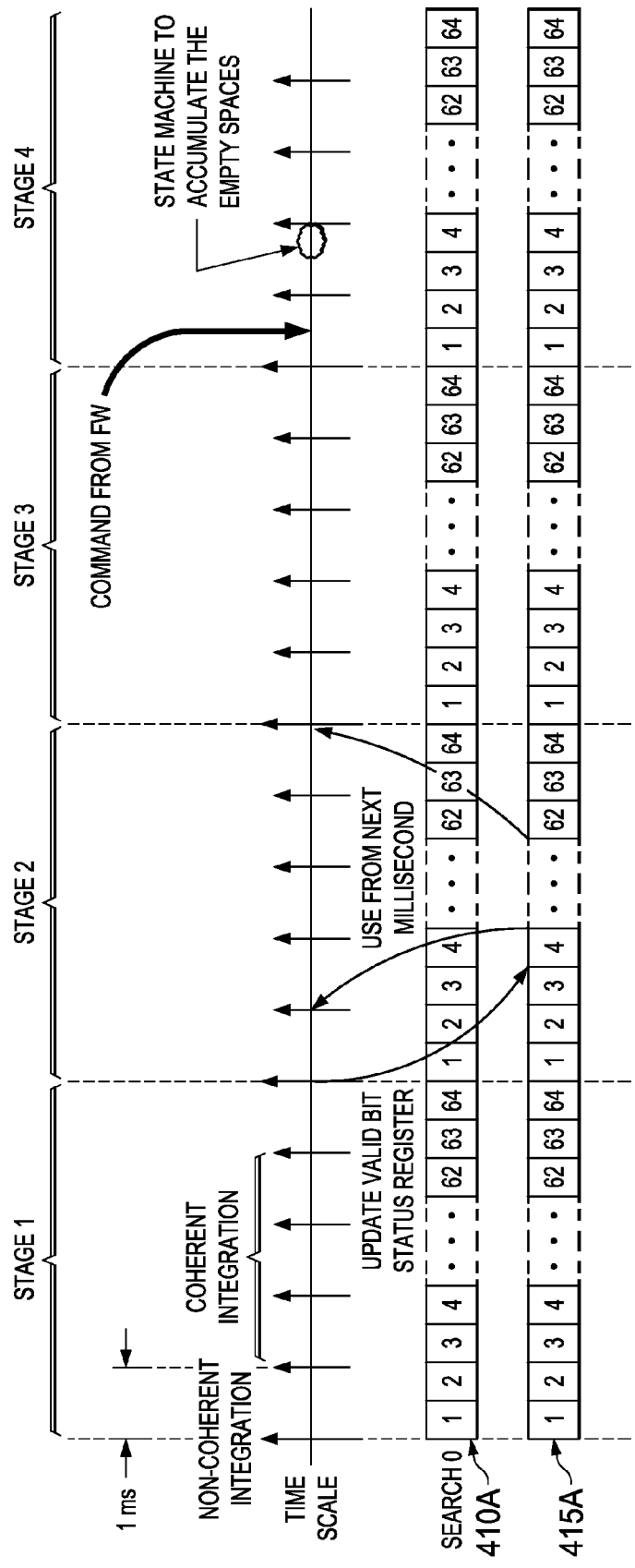
FIG. 8 illustrates state of registers of a memory squeezing unit during a search, in accordance with one embodiment.

FIG. 8 illustrates the state of the registers of the memory squeezing unit 250 during a search. In illustrated example, a (5, N) dwell is considered. (5, N) dwell indicates 5 coherent integrations and N non-coherent integrations. The coherent integration is performed on correlation results of the search every ms and the non-coherent integration is performed every 5 ms, N times.

The status register 410A and the shadow register 415A for the search are also illustrated. The bits of the status register 410A and the shadow register 415A at various stages are shown. In the illustrated example, each stage corresponds to 5 ms.

The status register 410A indicates valid bits for 64 groups of code phases corresponding to the search. In the illustrated example, the memory squeezing unit 250 detects a noise early termination. The memory squeezing unit 250 identifies group 405A62, group 405A63 and group 405A64 as groups to be dropped for the search. The shadow register 410A is updated accordingly and the valid bits (highlighted in gray in "Stage 2") corresponding to the group 405A62, the group 405A63 and the group 405A64 indicate that the group 405A62, the group 405A63 and the group 405A64 are to be dropped. The valid bits from the shadow register 415A can be used, from the ms next to the ms in which the valid bits are updated, for squeezing coherent data. Also, the status register 410A is updated based on the shadow register 415A after moving the non-coherent data in the next non-coherent data frame as shown at boundary of "Stage 2" and "Stage 3". The status register 410A is updated by moving bits of the shadow register 415A to the status register 410A.

In the illustrated example, when the memory squeezing unit 250 determines that the free sections of the memory 245 due to code phase search dropping are enough to start an additional search, the state machine starts concatenation of the free sections upon receipt of a command from the firmware (FW). In the illustrated example, the concatenation starts in "Stage 4".

Linked List for Searches

Figure 9:
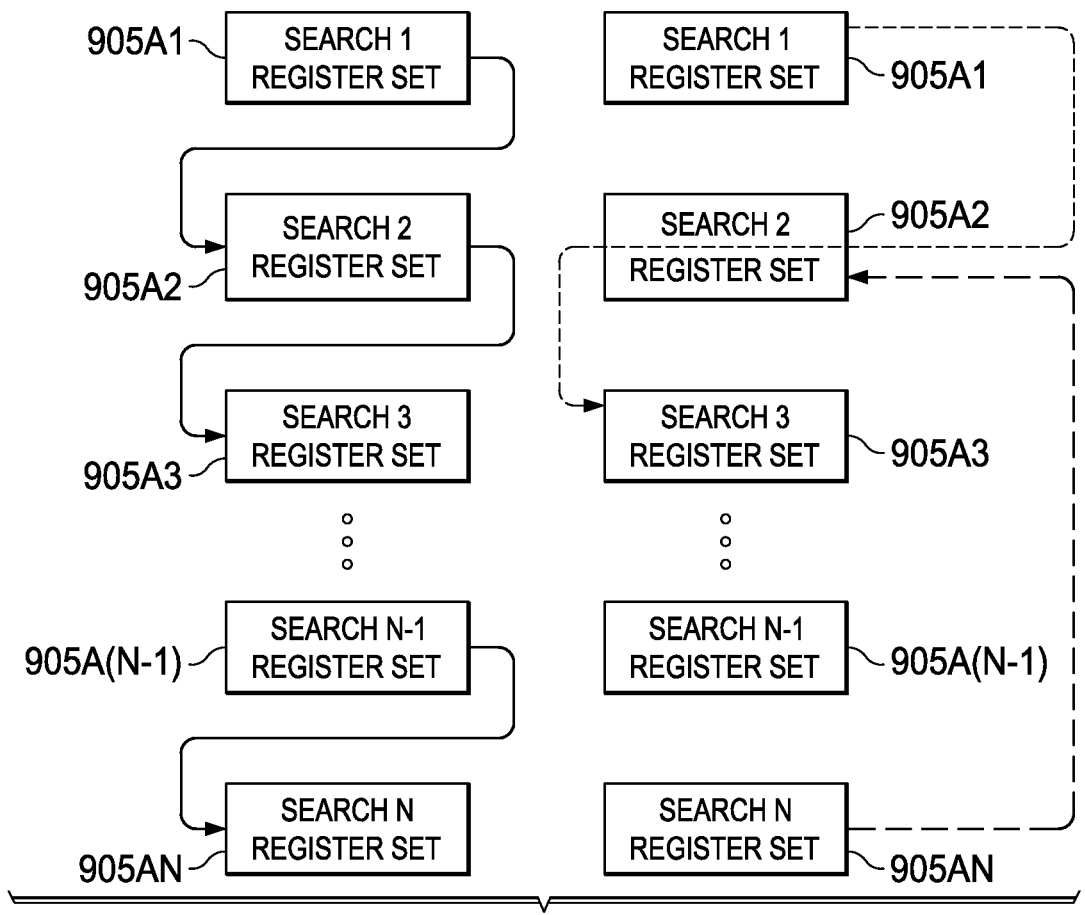
FIG. 9 illustrates a linked list implementation scheme, in accordance with one embodiment.

The memory squeezing unit 250 also hosts a linked list scheme to sequence searches and to allocate the concatenated free section to the additional search. The memory squeezing unit 250 includes one or more sets of configuration registers as shown in FIG. 9. One set corresponds to one search. The linked list scheme maintains a pointer scheme for the sets of configuration registers. For example, when a "search 2" for a "satellite 2" is dropped then a section of the memory 245 corresponding to the "search 2" is freed. The linked list scheme links a configuration register set 905A1 of "search 1" to a configuration register set 905A3 of "search 3". The linked list scheme also links a configuration register set 905AN of a last search in the searches to a configuration register set 905A2. The linked list scheme maintains an allocation of sections of the memory 245 and of the configuration registers to the searches in a sequence, thus enabling movement of data in the memory 245 in one direction.

When the concatenated section is allocated to the additional search, the linked list scheme links the configuration register set of the last search, for example 905AN (the last search is the search corresponding to a last non-free section in the memory) to a configuration register set of the additional search. The configuration register sets are updates based on the allocation.

The sequencing of searches and the allocation of the concatenated free section can be referred to as processing a sequence of searches. This sequence is an output of the memory squeezing unit 250. Inputs to the memory squeezing unit 250 include non-coherent integration results (non-coherent data), status of a dwell in a search, a search being processed (search number), and an enable signal. The memory squeezing unit 250 generates control bit outputs or updates the status of registers to be used by the correlator 235 or by the algorithms of the memory squeezing unit 250.

Outputs of the memory squeezing unit 250 (these outputs are control bit outputs) include a local code phase jump bit, a memory address offset generation bit, and a post processor control bit. The local code phase jump bit indicates that the code corresponding to a search being processed has to be jumped by 16 phases (shifted by 16 chips). The "memory address offset generation" bit indicates an offset to be added to the base address for the coherent data or to the base address for the non-coherent data to generate address of the location where a correlation result of the search being processed has to be stored.

Outputs of the memory squeezing unit 250, indicative of status stored in the registers, include an update of a base address for the coherent data for the search being processed, an update of a base address for the non-coherent data for the search, a processing sequence of searches, and code phases dropped due to noise early termination or signal early termination.

The memory squeezing unit 250 enables the portion 200 to allocate sections of the memory 245 of different sizes to different searches as per requirement. For example, the size of a section of the memory 245 required for a search in hot start mode of the receiver or assisted mode of the receiver is small than that required for cold start mode. Hot start mode can be defined as the mode when the receiver already has prior information available from a cellular network server. In the hot start mode, the receiver has stored almanac information for the satellite. The information can include position coordinates of the satellite. Hence, the receiver has information giving the rough position of the receiver and does not need to perform as many correlations as when the receiver does not have any such information. Since there are not many correlation results to be stored in the hot start mode, the size of the section of the memory 245 that must be allocated to the search can be less than that otherwise. Hence, the sizes of the sections allocated for different searches can be different and thus the memory 245 can be utilized more efficiently than in a case where the sizes of the sections allocated for different searches are fixed. Search capacity of the portion 200 depends on the size of the memory 245 and the computation capability of the correlator 235. The search capacity can be defined as the number of searches that can be performed by the portion 200 in a fixed time interval.

Figure 10:
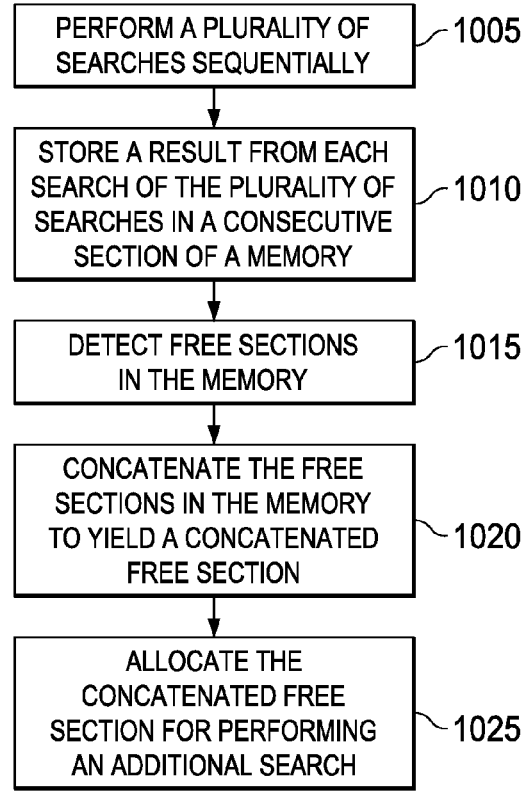
FIG. 10 illustrates a method for searching signals in a receiver, in accordance with one embodiment.

Referring to FIG. 10 now, a method for searching satellite signals in a receiver is illustrated.

A plurality of sections of a memory, for example the memory 245, is allocated for performing a plurality of searches. The allocation can be based on the mode of operation of the receiver and the algorithms supported by the receiver. One section corresponds to one search. Different sections can be of different sizes. Each section can further include two sub-sections. The two sub-sections include a sub-section corresponding to coherent integration results and a sub-section corresponding to non-coherent integration results. The allocation can be considered as a part of performing the searches.

At a step 1005, the searches are performed sequentially. Performing each search includes searching for presence of a satellite signal from a different one of a plurality of satellites in a received signal. Examples of the satellites include GPS satellites, Galileo satellites, GLONASS satellites, and Wide Area Augmentation System (WAAS) satellites.

In one embodiment, there are 32 GPS satellites and the receiver searches for the presence of one satellite signal from each satellite. When the presence of a satellite signal is identified by the receiver, a satellite corresponding to the satellite signal is said to be visible to the receiver. The receiver then maintains a fix to the satellite for receiving position coordinates of the satellite. These position coordinates enable calculation of the position of the receiver.

The 32 satellite signals are transmitted by the 32 satellites. Every satellite signal includes a code of the corresponding satellite that repeats every millisecond. The received signal is converted into digital samples and then filtered. The filtered samples are correlated with various codes sequentially. The codes are generated at the receiver. Each code corresponds to one satellite.

Each search includes correlations corresponding to one code, one Doppler hypothesis, and all code phases. The code phases are used to determine time lag between transmission of a satellite signal from a satellite and receipt of the satellite signal by the receiver. The Doppler hypothesis is used to account for an offset in frequency of the code corresponding to a Doppler shift in frequency of the received signal, due to relative motion between the satellite and the receiver. For detection of visible satellites and for good accuracy, the correlations are performed every millisecond and results of the correlation are integrated over several milliseconds. Integration includes coherent integration which includes summing the results over several milliseconds or frames. Integration also includes non-coherent integration which includes squaring multiple results of the coherent integration and summing the squares of the results.

At step 1010, a result of each search is stored in a consecutive section of the memory. The result includes coherent and non-coherent integration data which is stored in the memory.

At step 1015, free sections are detected in the memory allocated for performing the searches. The free sections can be detected in various ways. Two examples of detecting the free sections are now explained:

Example 1

Detecting the free sections includes detecting termination of any number of searches, for example detection of termination of a first search from the searches. The termination of the first search is detected if a SNR of the received signal is less than the second threshold. The SNR of the received signal is determined to be less than the first threshold if the sum of the correlation results after the time period or finish of dwell, is less than the first threshold. The finish of the dwell indicates that the coherent integrations and the non-coherent integrations are complete. The termination can also be detected if the SNR is well above the first threshold and hence presence of a satellite signal from a satellite is detected. Alternatively, the termination of the first search can be due to finish of dwell. The section allocated for the first search is then determined as a free section. The termination of the first search is also detected if a predetermined time of the first search for a particular sensitivity is completed in absence of a deterministic decision. The detection of absence or presence of the satellite signal is referred to as the deterministic decision.

Example 2

Detecting the free sections includes detecting termination of any number of code phases in the searches, for example termination of a code phase search in a second search from the searches. The code phase search corresponds to a group of code phases. In one example, the group of code phases includes 32 code phases. Detecting termination of the code phase search includes comparing the sum of the correlation result before finish of dwell with the second threshold and terminating the code phase search if the sum of the correlation result before finish of the dwell is less than the second threshold. The code phase search is explained in detail in conjunction with FIG. 3. The locations of the memory that become free due to the termination of the code phase search are referred to as the free sections.

At step 1020, the free sections are concatenated to yield a concatenated free section. The free sections are concatenated by shifting coherent and non-coherent integration results of one or more correlations corresponding to the searches from one or more non-consecutive sections in the memory to one or more consecutive sections in the memory. The shifting and concatenation has been explained above in detail in conjunction with FIG. 3 and FIG. 6. The free sections are concatenated if the free sections, in conjunction, are sufficient for enabling an additional search.

At step 1025, the concatenated free section is allocated for performing the additional search. The concatenated free section is allocated to the additional search if the concatenated free section is determined to be sufficient to store integration results corresponding to the additional search. Further, one or more sets of configuration registers (for example as shown in FIG. 9) are assigned to the searches. The sets of configuration registers initiate setup of the concatenated free section for the additional search and enable coordination of data transfer to and from the concatenated free section while the additional search is being performed. The allocation of the concatenated free section includes linking a set of configuration registers corresponding to the address of a last non-free section of the memory to another set of configuration registers corresponding to the starting address of the concatenated free section of the memory. Linking of the sets of configuration registers can be implemented through a linked list. The last non-free section corresponds to a last search that is active from the searches being processed. The linking has been explained above in detail in conjunction with FIG. 3 and FIG. 6.

In one embodiment, the concatenated free section can also be allocated for tracking the visible satellite when presence of the satellite signal corresponding to the visible satellite is identified in the input signal.

Figure 11:
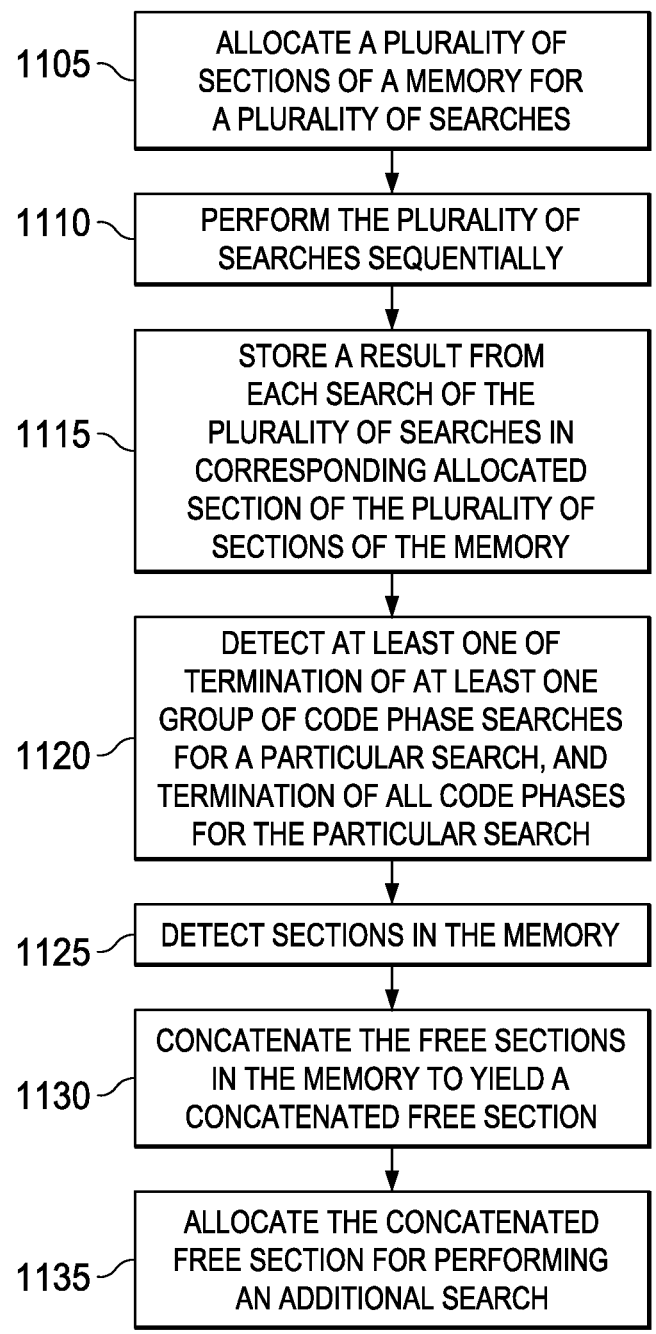
FIG. 11 illustrates a method for searching presence of signals from a plurality of satellites in a global navigation satellite system receiver.

Referring to FIG. 11 now, a method of searching satellite signals from a plurality of satellites in a global navigation satellite system receiver, for example the receiver that includes the portion 200, is illustrated.

At step 1105, a plurality of sections of a memory are allocated for a plurality of searches. The sections can be allocated based on the mode of operation of the receiver and the algorithms supported by the receiver. In some embodiments, if no prior searching is done then the sections allocated for each search can be of identical size. One section corresponds to one search.

A signal received by the receiver includes the signals, also called satellite signals, from the plurality of satellites. In one embodiment, the received signal includes signals from 32 satellites. The position of the receiver can be calculated based on information in the signals. The plurality of searches is performed sequentially until detection in the received signal of the presence of the desired number of satellite signals for determining the position of the receiver.

At step 1110, the searches are performed sequentially. The searches determine the presence of one or more of the satellite signals in the received signal. Each search is performed by correlating the received signal with a code from a plurality of codes generated at the receiver. One code corresponds to one satellite.

Correlation is performed between the received signal and a first one of the codes. The first code is shifted by 1 chip and correlation is performed again. The correlation is repeated until the first code is shifted by N chips, where N is a maximum number of times shifting can be performed. Each shifted version of the first code is called a code phase and accounts for a time lag between transmission of the signals from the satellites and reception of the signals. The correlation corresponding to each code phase can also be called a code phase search.

Also, the correlation is performed for a Doppler hypothesis. The Doppler hypothesis accounts for a shift in frequency in the received signal due to relative motion between the satellites and the receiver. The search is thus a 3-dimensional search that includes searching for the first code for all the code phases for one Doppler hypothesis. In one embodiment, a next search in sequence can include searching for the code for all the code phases for another Doppler hypothesis. In another embodiment, the next search can include searching for a second code for all the code phases for one Doppler hypothesis.

For good accuracy, correlation corresponding to a Doppler hypothesis, a code phase, and a code is performed every millisecond and results of the correlation are integrated over several milliseconds. Integration includes coherent integration which includes summing the results over several milliseconds or frames. The integration also includes non-coherent integration which includes squaring multiple results of the coherent integration and summing the squares of the results.

At step 1115, a result from each search is stored in a corresponding allocated section of the memory. The result includes coherent and non-coherent integration data which are stored in the memory.

At step 1120, at least one of (a) termination of at least one group of code phase searches, for example two code phase searches, for a particular search in the searches, and (b) termination of all code phases, for example a first search and a code phase search in a second search, for the particular search from the searches is detected. In other words, termination of any number of searches, or termination of any number of code phase searches, or a combination of both is detected. The termination of the first search can be detected based on detection of absence or presence of a satellite signal corresponding to the first search. The detection of absence or presence of the satellite signal is referred to as a deterministic decision. The termination of the first search can also be detected if a predetermined time of the first search for a particular sensitivity is completed in absence of the deterministic decision. The termination of the code phase search in the second search can be detected based on comparison of SNR of the received signal with the second threshold. If the SNR is below the second threshold, a satellite signal corresponding to the second search is determined to be absent. If the SNR is above the second threshold, the satellite signal corresponding to the second search is determined to be present.

At step 1125, free sections are detected in the memory based on detection of termination or finish of dwell. The finish of the dwell indicates that coherent integrations and non-coherent integrations are complete. For example, due to termination of the first search or the code phase search, integration results need not be stored in the memory, thus freeing up the sections.

At step 1130, the free sections in the memory are concatenated to yield a concatenated free section. The free sections are concatenated by shifting coherent and non-coherent integration results of one or more correlations corresponding to the searches from one or more non-consecutive sections in the memory to one or more consecutive sections in the memory. The shifting and concatenation has been explained above in detail in conjunction with FIG. 3 and FIG. 8. The free sections are concatenated if the free sections, in conjunction, are sufficient for performing an additional search.

At step 1135, the concatenated free section is allocated for performing a search, for example the additional search, which is different than the plurality of searches.

Sections of different sizes can be selected based on the mode of operation of the receiver. This selection helps increase efficiency and optimal use of the memory 245. The additional search can be performed when free sections in the memory 245, in conjunction, are sufficient for performing the additional search. Hence, allocation of the free sections for performing the additional search is independent of completion of all ongoing searches. Further, since sections of different sizes can be allocated for performing the searches, the number of searches performed by the portion 200 can be high and hence, the search capacity of the portion 200 might also increase. Also, time taken by the portion 200 for the searches and for the time-to-first-fix is minimized.

The portion 200 provides good performance in terms of power consumed. The portion 200 also occupies minimal area on a chip since the required size of the memory 245 is reduced. Minimization of the size of the memory 245 also reduces the cost of the portion 200.

In the foregoing discussion, the term "coupled" refers to either a direct electrical connection between the devices connected or an indirect connection through one or more passive or active intermediary devices. The term "signal" means at least a data signal, or other signal.

Those skilled in the art will recognize that a wide variety of modifications, alterations, and combinations can be made with respect to the above described embodiments without departing from the scope of the present disclosure, and that such modifications, alterations, and combinations are to be viewed as being within the ambit of the inventive concept.

The foregoing description sets forth numerous specific details to convey a thorough understanding of embodiments of the present disclosure. However, it will be apparent to one skilled in the art that embodiments of the present disclosure may be practiced without these specific details. Some well-known features are not described in detail in order to avoid obscuring the present disclosure. Other variations and embodiments are possible in light of above teachings, and it is thus intended that the scope of present disclosure not be limited by this Detailed Description.

What is claimed is:

1. A receiver comprising:
   A. a correlator;
   B. a memory; and
   C. a memory squeezing unit in electronic communication with the correlator and the memory, the memory squeezing unit including:
   i. a plurality of status registers,
   ii. a plurality of shadow registers,
   iii. a plurality of sets of configuration registers, and
   iv. a state machine in electronic communication with the plurality of status registers, the plurality of shadow registers, and the plurality of configuration registers to enable searching for presence of data in a received signal by processing the received signal, moving bits from the plurality of shadow registers to the plurality of status registers based on the processing, and updating the plurality of configuration registers based on the processing.

2. The receiver as claimed in claim 1 including an antenna, a processing unit coupled to the antenna, an analog-to-digital converter (ADC) coupled to the processing unit, and a plurality of buffers coupled to the ADC.

3. The receiver as claimed in claim 2 in which the processing unit converts the received signal into an intermediate frequency (IF) signal, and the ADC converts the IF signal into digital samples and provides the digital samples to the plurality of buffers.

4. The receiver as claimed in claim 2 in which the receiver is included comprised in a global navigation satellite system receiver.

5. The receiver as claimed in claim 1 in which the correlator sequentially correlates the received signal with a plurality of codes to produce a plurality of results and stores each result in a consecutive section of the memory and one code and one result corresponds to a different satellite of a plurality of satellites, and the memory squeezing unit detects free sections of the memory, concatenates the free sections, and allocates concatenated free section for storing a correlation result of an additional correlation.

* * * * *